(12) United States Patent
Piasecki

(10) Patent No.: US 7,126,206 B2
(45) Date of Patent: Oct. 24, 2006

(54) DISTRIBUTED CAPACITOR ARRAY

(75) Inventor: Douglas S. Piasecki, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 63 days.

(21) Appl. No.: 11/026,967

(22) Filed: Dec. 30, 2004

(65) Prior Publication Data

US 2006/0145231 A1    Jul. 6, 2006

(51) Int. Cl.
*H01L 29/00* (2006.01)
*H01L 21/20* (2006.01)

(52) U.S. Cl. .................. 257/532; 257/659; 438/396

(58) Field of Classification Search ................ 257/532, 257/758, 659; 438/396, 622
See application file for complete search history.

(56) References Cited

U.S. PATENT DOCUMENTS 6,268,779 B1 * 7/2001 van Zeijl .............. 331/117 FE

* cited by examiner

*Primary Examiner*—Mark V. Prenty
(74) *Attorney, Agent, or Firm*—Howison & Arnott, L.L.P.

(57) ABSTRACT

A capacitor structure in an integrated circuit includes a capacitor region defined within the boundaries thereof with an active circuit layer formed on the surface of the semiconductor substrate. A planarization layer is disposed over the active circuit layer and electrically isolated therefrom in at least the capacitor region. A metal capacitor layer is formed over the planarization layer within the capacitor region and having the bottom plates of a plurality of capacitors defined therein. A layer of dielectric is formed on the bottom plates of the plurality of capacitors of a predetermined thickness. A top plate is formed on the dielectric for each of the plurality of capacitors to define each of the plurality of capacitors, such that a portion of each of the bottom plates extends outside of the boundaries of the associated top plate.

18 Claims, 6 Drawing Sheets

DISTRIBUTED CAPACITOR ARRAY

TECHNICAL FIELD OF THE INVENTION

The present invention is related in general toward semiconductor capacitors and, more particularly, to a unique capacitor utilized in a capacitive array for a data converter such as an analog-to-digital SAR converter.

BACKGROUND OF THE INVENTION

Data converters for converting analog data to digital data utilize an analog-to-digital converter of the successive approximation type and operating with a SAR algorithm. These converters utilize a switched capacitor array that is binary weighted for redistributing charge. The binary weighted capacitor array has a plurality of capacitors, each having a top plate connected to a common node and a bottom plate, each capacitor having the associated bottom plate connected to individual switches. The bottom plates of the capacitors are switched between a reference voltage, an input voltage and ground, depending upon the particular SAR algorithm. This is conventional. Each of the capacitors ranges from a first value of C, a second value of 2C, a third value of 4C, a fourth value of 8C, etc., in a binary weighted manner. In order to ensure that the capacitor ratios are correct, these capacitors are typically configured with the use of a plurality of unit capacitors of value "C." Thus, the first capacitor will be a single capacitor value "C" utilizing a single unit capacitor. The next capacitor, the 2C capacitor, will require a value of "2C" requiring two unit capacitors of value "C." The next capacitor in the binary sequence will be four unit capacitors to give a total value of "4C," the next one being eight unit capacitors for a total of "8C," and so on. Each of these C, 2C, 4C, 8C, . . . , capacitors is comprised of a sub array of unit capacitors, where "C" ins the unit capacitance value. It is important when manufacturing the unit capacitors and interconnecting them to form the unit capacitor sub arrays that the capacitance values be true, i.e., that the 8C capacitor be exactly eight times the value of the unit capacitor 1C. Since the capacitors are typically configured in some type of bulk array and are disposed typically in association with other capacitors, some in the associated sub array and some associated with other sub arrays, there will be certain characteristics that must be considered. For example, the first capacitor in the array is a single unit capacitor value "C." The capacitor 4C will have four unit capacitors. If these unit capacitors are disposed in a 2×2 array, this will mean that four of the capacitors will have two exposed sides with the other two sides being associated with adjacent capacitors in other sub arrays. This could result in a different capacitance value in total than the expected 4C value. Thus, the design of the capacitive array must account for various parasitics and the such in the design thereof.

SUMMARY OF THE INVENTION

The present invention disclosed and claimed herein, in one aspect thereof, comprises a capacitor structure in an integrated circuit A semiconductor substrate includes a capacitor region defined within the boundaries thereof. An active circuit layer is formed on the surface of the semiconductor substrate with a portion thereof formed in the surface of the semiconductor substrate and a portion thereof formed over the surface of the semiconductor substrate, in which is formed active circuitry and interconnects. A planarization layer of metal is disposed over the active circuit layer and electrically isolated therefrom in at least the capacitor region. A metal capacitor layer is formed over the planarization layer within the capacitor region and having the bottom plates of a plurality of capacitors defined therein. A layer of dielectric is formed on the bottom plates of the plurality of capacitors of a predetermined thickness. A top plate is formed on the dielectric for each of the plurality of capacitors to define each of the plurality of capacitors, such that a portion of each of the bottom plates extends outside of the boundaries of the associated top plate. A plurality of vias is connected to the portion of select ones of the bottom plates and to structures beneath the planarization layer, and wherein vias are not formed within the region beneath the top plate and above the planarization layer.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
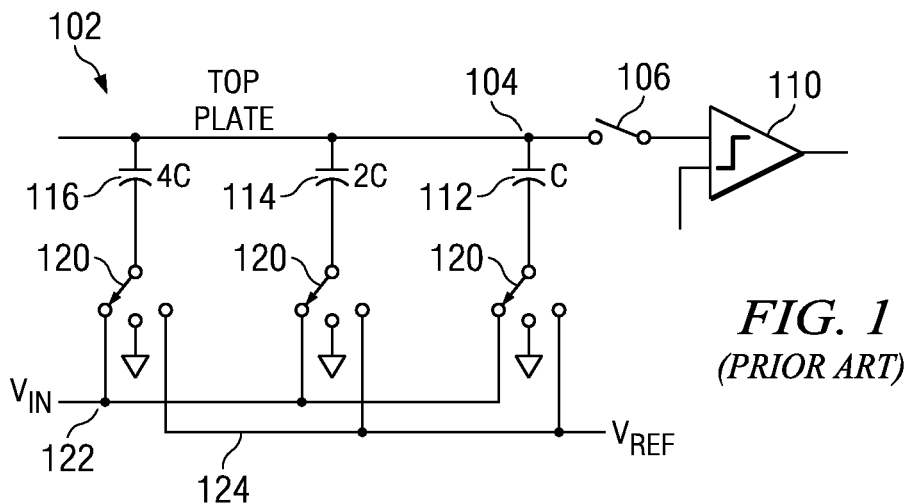
FIG. 1 illustrates a diagrammatic view of a prior art data converter.

Referring now to the drawings, and more particularly to FIG. 1, there is illustrated a diagrammatic view of a prior art data converter, a conventional data converter. This data converter is a successive approximation data converter that employs a "binary search" algorithm in a feedback that includes a DAC. This typically involves some type of sample and hold circuit on the front end of the data converter, a comparator, a shift register and a digital-to-analog converter. One type of successive approximation A/D converter is a charge redistribution architecture converter. This is illustrated in the prior art representation of FIG. 1. This charge redistribution data converter utilizes a DAC based on the use of binary-weighted capacitors in a capacitor array 102. The top plate of a plurality of capacitors is connected to a node 104 to one input of a comparator 110. A plurality of capacitors in the arrays are provided which are based on, as illustrated, a unit capacitor 112 which has a value of "C." A second binary weighted capacitor 114 has the value of "2C" and a third binary weighted capacitor 116 has a value of "4C." This continues onward for 8C, 16C, 32C, 64C, . . . . To further facilitate the use of the arrays, although not shown, bridge capacitors between arrays will be utilized such that very large capacitors are not required and the overall capacitor array is configured of a plurality of smaller binary weighted capacitor arrays bridged with a series capacitor of value $C_{Bridge}$.

Each of the capacitors 112–116, (and the remaining capacitors that are not shown) each have the bottom plates thereof connected to an associated switch 120. The switch 120 for each of the capacitors 112 is selectively operable to connect the bottom plate thereof to either an input voltage on a node 122, ground, or a reference voltage on a node 124. This is a conventional type of architecture. However, it is important that, during the charge redistribution operation, that the capacitor values be accurate, i.e., that the capacitor 116, for example, have exactly four times the capacitance of capacitor 112. By utilizing unit capacitors that each have identical structure, an array can be fabricated. However, it is still important that all of the parasitics between the various capacitors and the array be considered.

Figure 2:
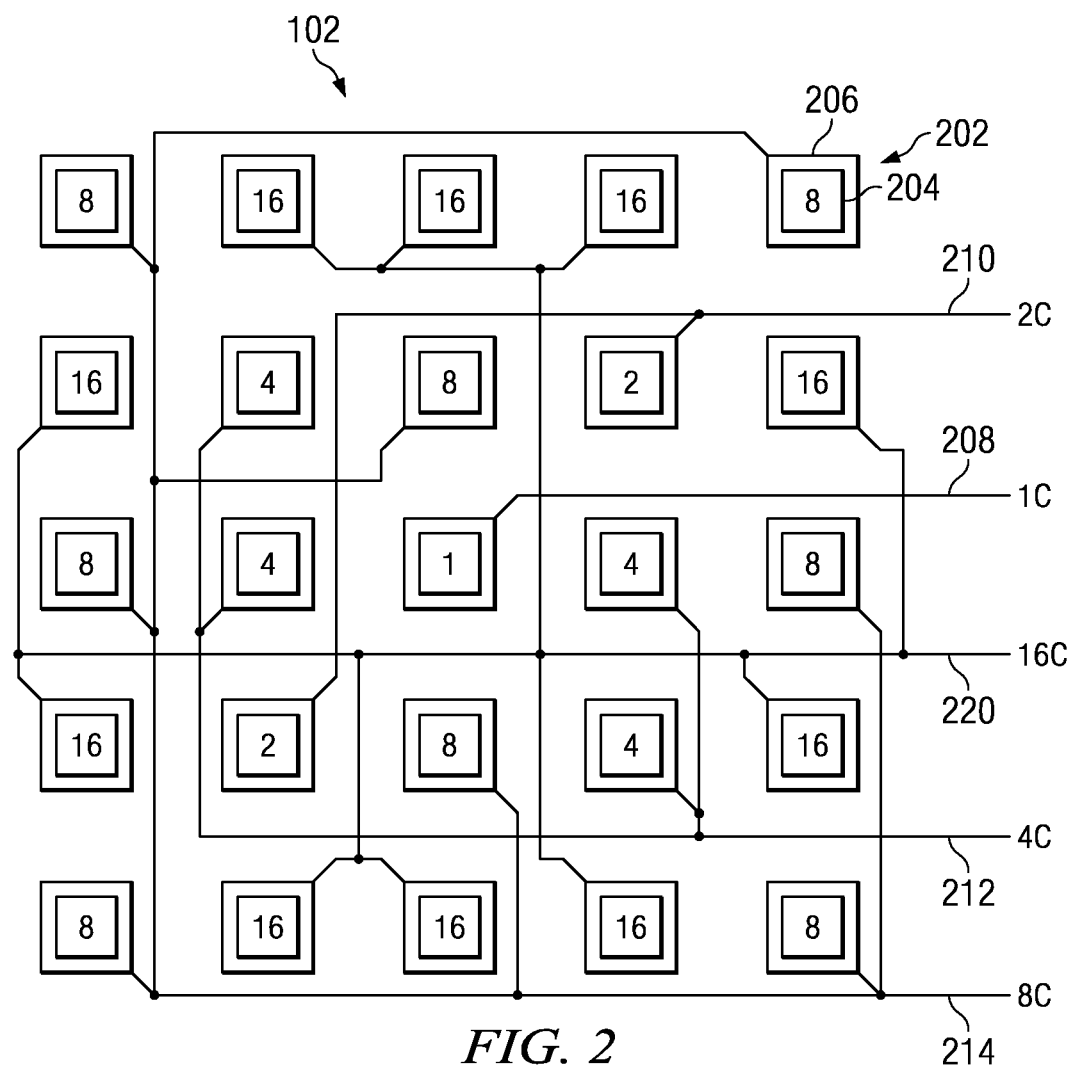
FIG. 2, there is illustrated a diagrammatic view of a capacitor array.

Referring now to FIG. 2, there is illustrated a diagrammatic view of a capacitor array. Each capacitor therein is configured of a unit capacitor 202. One unit capacitor 202 on the upper right hand corner of the array is illustrated, where this unit capacitor has a top plate 204 and a bottom plate 206. Each of the capacitors in the array is identical. The array is configured such that the first capacitor, the unit capacitor value "C," is disposed at the center of the 5×5 array. This 5×5 array is only a representative sample of the array. This portion of the array illustrates the 1C capacitor, the 2C capacitor, the 4C capacitor, the 8C capacitor and part of the 16C capacitors. It can be seen that the 1C capacitor is surrounded on either corner by the 2C capacitors, the 4C capacitors are disposed on either side of the 1C capacitor and the 8C capacitors are disposed about all the other capacitors. This is by way of example only and represents a common centroid layout. The reason for this is that, if there is a slight gradient in the oxide thickness on one side of the array due to manufacturing processing, as compared to the other side of the array, an increase in capacitance on one side of the array will be reflected in a decrease in the capacitance on the other side, thus balancing the overall sum of the capacitance. It is then only necessary to interconnect all of the bottom plates of the common capacitors in a particular grouping to a single node, with all of the top plates connected together to the node 104. For example, the bottom plate of the center capacitor is the 1C capacitor and it is connected to a node 208. The bottom plates of the 2C capacitors are connected to a node 210, the bottom plates of the 4C capacitors are connected to a node 212, the bottom plates of the 8C capacitors are connected to a node 214 and the bottom plates of the 16C capacitors are connected to a node 220. Of course, there are only illustrated ten 16C capacitors, it being understood that the remaining six 16C capacitors in the remaining part of the array that is not illustrated.

It can be seen that, even with the common centroid layout, each of the capacitors is disposed within the array in a slightly different manner. For example, the 1C capacitor, at the center, has no adjacent capacitors in its particular sub array associated therewith. Similarly, the 8C capacitors are also similarly situated. The sub array of 4C capacitors each have one side associated with one of the capacitors in its separate 4C sub array, and so on. It should be understood that this is just an example and there could be many different configurations and layouts.

Figure 3:
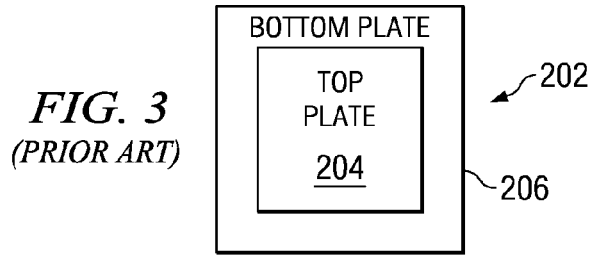
FIG. 3 illustrates a further view of each of the capacitors.

Referring now to FIG. 3, there is illustrated a further view of each of the capacitors 202, this being a prior art structure. In this structure, there will be a provided the top plate 204 and bottom plate 206. Typically, the bottom plate 206 will be larger than the top plate 204 and, as such, the bottom plate 206 can have vias disposed there through to upper layers or lower layers for separate connection thereto. The top plates 204 of each of the capacitors 202 are typically connected together, this being easier to fabricate.

Figure 4:
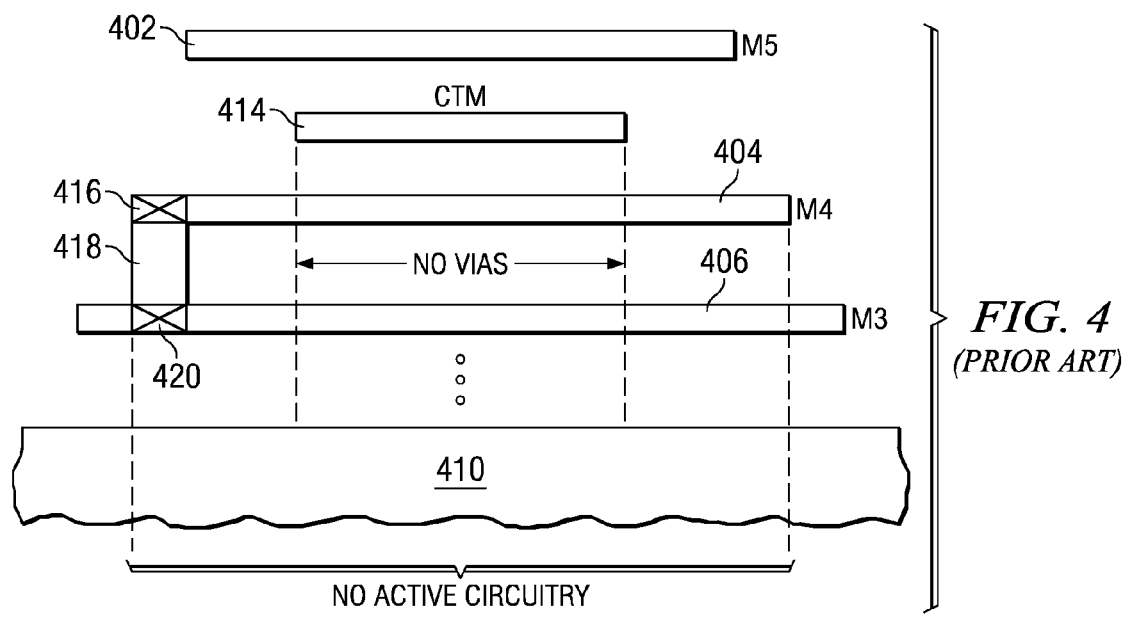
FIG. 4 illustrates a cross-sectional view of each of the capacitor structures on the substrate.

Referring now to FIG. 4, there is illustrated a cross-sectional view of each of the capacitor structures on the substrate. This is a prior art system that illustrates how capacitors are configured in a design process. In this specific design process, the capacitor is defined as a unique device that is disposed between the two top metal layers with the lowermost layer thereof comprising the bottom plate of the capacitor. In this illustration, there are five metal layers. The top metal layer, a layer 402, is the fifth metal layer on metal 5 (M5). The next lower layer is a layer 404, metal 4 (M4). The next layer, a layer 406, is the third metal layer, metal 3 (M3). This continues downward through metal 2 and metal 1 and even to poly layers, poly 1 and poly 2. All of the metal layers are disposed over and above a substrate 410.

A separate metal layer is provided from which to fabricate the upper plate of the capacitor, this referred to herein as the "top plate layer" (TPL) layer 414 is provided in the process that is dedicated to this function alone and is not available for other structures, and this is disposed between M5 and M4. This layer is only utilized for forming capacitors. There are a set of design rules that are associated with the TPL 414. The design rules require that below the boundaries of the TPL 414, that no vias be disposed. Therefore, if the bottom layer 404 at M4 is to be connected to another layer, the via must be outside of the peripheral edge of the TPL 414. A via 416 is illustrated on the edge of the M4 layer 404, which layer 404 comprises the bottom plate of the capacitor. This via 416 connects to a via 420 in the M3 layer 406. Therefore, interconnects can be provided in the M3 layer 406. Additionally, another design rule is that there can be no active circuitry disposed beneath the capacitor region, which is approximately defined as the peripheral edges of the bottom plate formed out of the M4 layer 404. The reason for this is that any circuitry that is disposed beneath the TPL 414 could cause a variation in the topology thereof which could affect the oxide thickness and alter the value of the capacitor relative to other capacitors in the array or have some electrical coupling between the active circuitry and the capacitor. Therefore, vias are restricted from being beneath the TPL 414. If active circuitry were disposed, for example, in the lower layers, this could cause certain variations in the thicknesses of the upper layers and, consequently, restrictions are made as to the active circuitry disposed under the region beneath the bottom plate of the capacitor, this being the capacitor region.

Figure 5:
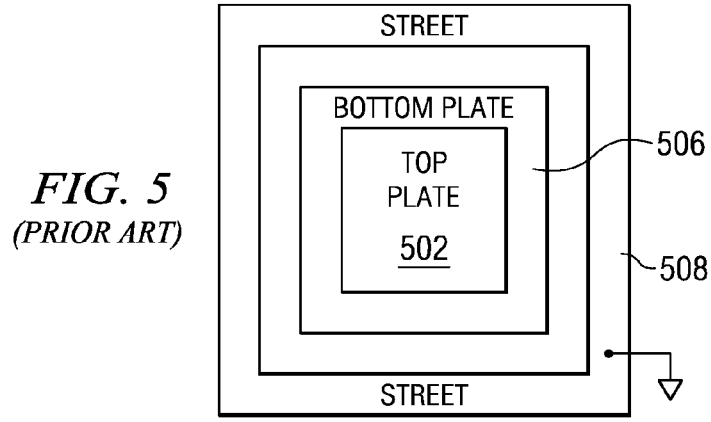
FIG. 5 illustrates a top view of a conventional capacitor formed in the structure of FIG. 4.

Referring now to FIG. 5, there is illustrated a top view of a conventional capacitor formed in the structure of FIG. 4. The design rules require that a top plate 502 formed at the TPL 414 be disposed such that the peripheral edges thereof are disposed a predetermined distance from the peripheral edges of a bottom plate 506 formed from the M4 layer 404. Typically, a street layer connected to ground will be formed as a structure 508 that is disposed about the periphery of the entire capacitor in each of the TPL 414 and the M4 layer 404, although illustrated as a single layer. These layers will basically reduce the parasitics between adjacent capacitors, this being a conventional structure. However, the design rules require that the inner peripheral edge of each of the street layers be disposed a predetermined distance from the edge of the associated other layers. Again, this is a conventional structure and will be described hereinbelow with respect to the disclosed embodiment of the present invention.

Figure 6:
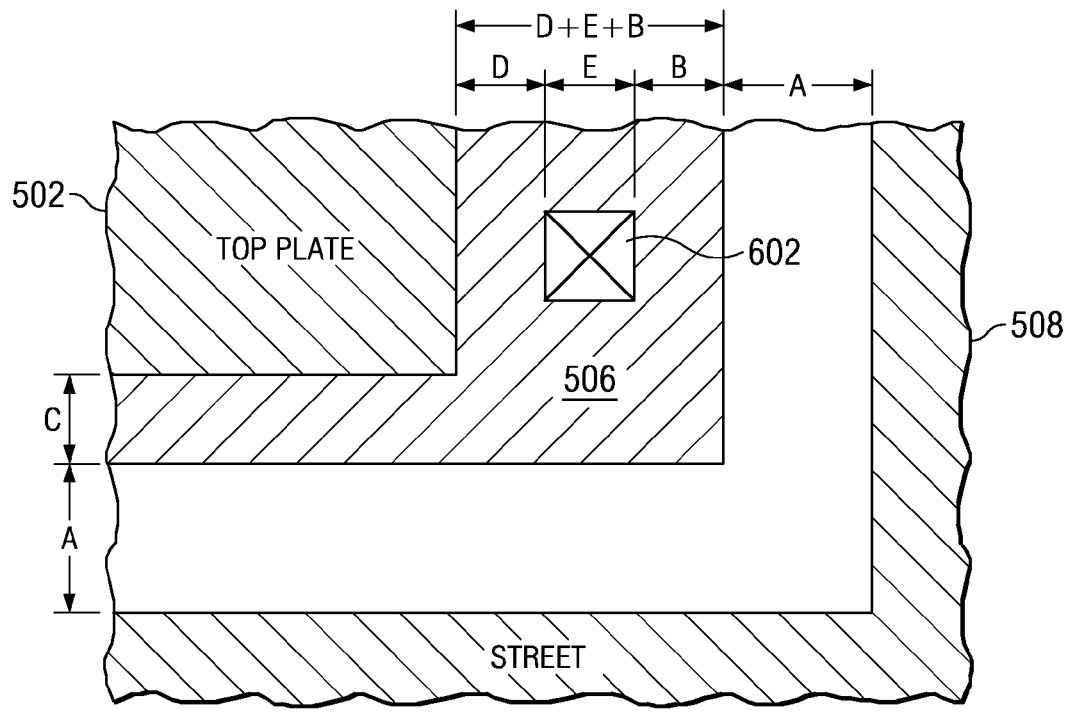
FIG. 6 illustrates a top level view of one corner of the capacitors illustrating the design restriction provided by the manufacturing facility.

Referring now to FIG. 6, there is illustrated a top level view of one corner of the capacitors illustrating the design restriction provided by the manufacturing facility. The top plate 502 has an edge that must be restricted within certain dimensions relative to the edge of both a via 602 and an edge of the bottom plate 506. In this embodiment, the dimensions are denoted in alpha characters. The via 602 has a width of "E" and the distance of the via 602 from the edge of the top plate 502 is a dimension "D." The via must be a distance "B" from the edge of the bottom plate 506. Therefore, the distance between the edge of the top plate 502 and the edge of the bottom plate 506 when a via is disposed in the bottom plate 506 is a distance of "D+E+B." The street structure 508 must be a distance of "A" from the edge of the bottom plate 506. Therefore, when a via is disposed in the bottom plate 506, then the distance from the edge of the top plate 502 to the street structure 508 is a distance of "D+E+B+A." However, if there is no via 602 disposed therein, then the distance between the edge of the top plate 502 and the edge of the bottom plate 506 is a distance of "C." This can be seen on the lower edge of the top plate 502 in FIG. 6. However, the street structure 508 is still required to be disposed a distance of "C" from the edge of the bottom plate 506. Therefore, when via 602 is disposed in the bottom plate 506 adjacent one of the edges at the top plate 502, then the distance between the edge of the top plate 502 and the edge of the street structure 508 will be a distance of "C+A." It can be seen that, when complying with these restrictions, the disposal of a via in the bottom plate 506, which must be disposed therein in order to interconnect the bottom plate 506 with other structures, there is a significant amount of wasted area. This wasted area does not contribute to the capacitance but, rather, takes away from the available area on the substrate, since inclusion of this additional area to accommodate the via 602 restricts further structures from the disposed beneath the capacitor structure. For a large array of capacitors, this can add up.

Figure 7:
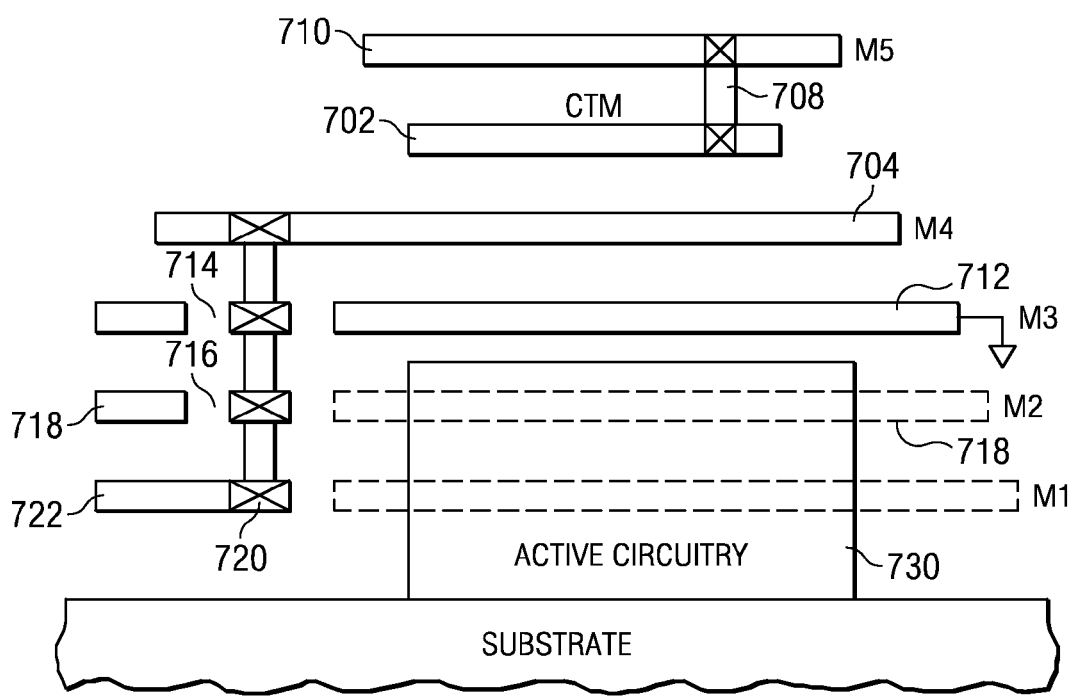
FIG. 7 illustrates a diagrammatic view of the presently disclosed embodiment.

Referring now to FIG. 7, there is illustrated a diagrammatic view of the presently disclosed embodiment utilizing the structure of FIG. 4 wherein a capacitor top metal layer is dedicated between the M5 layer 402 and the M4 layer 404. In the embodiment of FIG. 7, there is provided a capacitor structure that was formed of a top plate 702 formed in the TPL and a bottom plate 704 formed in the M4 layer. The top plate 702 is interconnected with an interconnect via 708 to a top metal interconnect layer 710 in the M5 layer. The capacitor formed of the top plate 702 and the bottom plate 704 is one of a plurality of capacitors in the array. Each of the capacitors has the top plate thereof connected to the interconnect 710, as will be described hereinbelow. However, each of the bottom plates 704 can be selectively connected to another interconnect layer which can interconnect that bottom plate to other capacitors in a sub-array and then to the switches. A planarization layer 712 is provided in the M3 layer. The M3 layer is provided underneath the capacitor array for the purpose of planarizing the surface and also for providing an electrical shield. If there are no interconnects in the M3 layer, then it is not necessary to have the M3 layer in a conventional circuit. However, this M3 layer is provided as a non-interconnect layer that only has openings 714 disposed therein for allowing interconnects from the bottom plate 704 to be made there through to a lower layer, such as the M1 layer or the M2 layer. In this embodiment, the bottom plate 704 is illustrated as being connected through an opening in the M3 layer 712 through an opening 716 in an M2 layer 718 which may have structures disposed therein and finally interconnected to a via 720 in an M1 layer 722. However, in a disclosed embodiment, it is only necessary to go to the M2 layer 718 for interconnects. This interconnection from the bottom plate 704 to the interconnect 720 allows the bottom plate of the capacitor 704 to be connected together in a sub-array and also to be connected to one side of the switch (not shown) in the capacitor array 102 described hereinabove with respect to FIG. 1. Therefore, the bottom plate 704 of each capacitor must have at least one via for interconnecting to a lower layer. Further, as will be described hereinbelow, because of the planarizing layer 712, active circuitry 730 can be disposed beneath the capacitor structure, which is typically not authorized by the design rules of the process which does not address the use of a planarizing layer. This planarizing layer 712 is typically connected to ground to reduce any parasitics between adjacent capacitors and to ensure that all of the bottom plates 704 of all of the capacitors have a common parasitic capacitance to a known voltage. However, the design rule restricting vias from being disposed in the bottom plate 704 within the boundary of the TPL 702 are adhered to and such is restricted.

Figure 8:
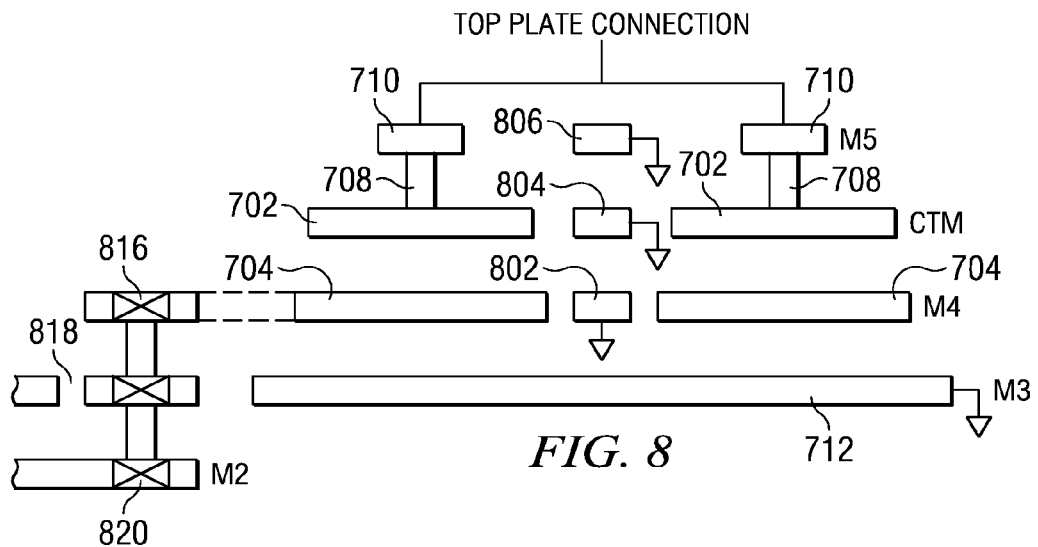
FIG. 8 illustrates a further view of the capacitor structure of FIG. 7 illustrating two capacitors and the associated structure.

Referring now to FIG. 8, there is illustrated a further view of the capacitor structure of FIG. 7 illustrating two adjacent capacitors and their associated structure. In these two capacitors, it can be seen that the bottom plate 704 of adjacent capacitors has a street structure 802 disposed therebetween that is connected to ground. Similarly, there is a street structure 804 disposed within the TPL between the adjacent top plate 702 of the respective capacitors and within the TPL. Within the M5 layer, there is provided a street structure 806 between the capacitors, and which street structure is connected to ground, as is the street structure 804 and street structure 802. Thus, even if the two capacitors are not in the same sub-array, there will be a parasitic capacitor from the top metal 702 to an associated street structure 804 in that layer which will make capacitors not in sub-arrays appear to be the same. Therefore, the street structures basically provide an isolation of capacitors to more readily define each unit capacitor as an exact value of that unit capacitor even when disposed in a sub-array as compared to a capacitor not disposed in the same sub-array.

Each of the bottom plates 704 is provided with one of a plurality of possible interconnections in the M4 layer to a via 816 which is interconnected through an opening 818 in the M3 layer to a via 820 in the M2 layer for interconnection with a switch and/or other capacitor bottom plates. This interconnection is only made if it is desirable to interconnect with the bottom plates of non-adjacent capacitors or switches. For an adjacent capacitor, the via 816 is connected to up to four capacitors, as will be described hereinbelow.

Figure 9:
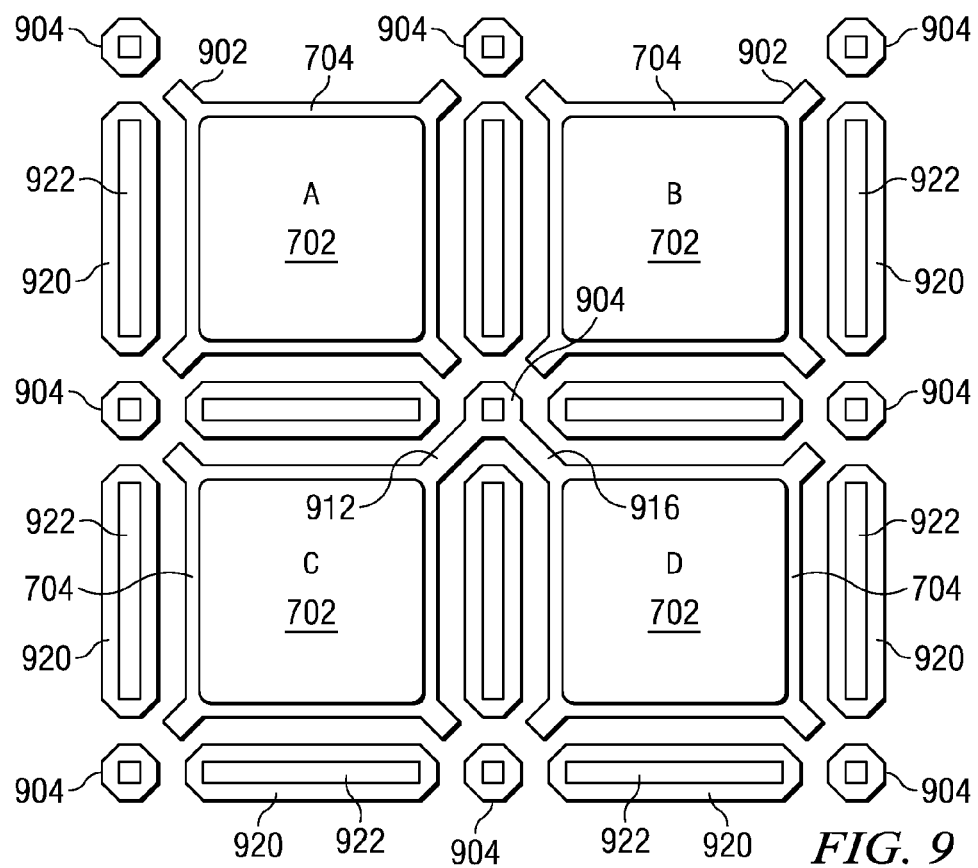
FIG. 9 illustrates a top view of the capacitor array illustrating four capacitors of the structure illustrated in FIG. 8.

Referring now to FIG. 9, there is illustrated a top view of the capacitor array illustrating four capacitors of the structure illustrated in FIG. 8 with the cross section taken along the diagonal of the capacitor from an interconnect via to the center and then traversing along the horizontal for illustrative purposes. Each of the capacitors is comprised of the upper plate 702 and the bottom plate 704. Each of the bottom plates 704 has disposed at the corner thereof a protrusion or plug 902 which is operable to be connected to an interconnect 904 and which protrusion comprises a programmable plug for each capacitor. The interconnect 904 is disposed at the corner of each of the bottom plates of each of the capacitors. Each of the capacitors have a protrusion 902 on each of the corners of bottom plate 704. These are selectively connected to the associated interconnect 904 if it is necessary to interconnect with an adjacent capacitor or with the bottom plate of another capacitor somewhere else in the array. In this illustration, there are illustrated four capacitors, "A," "B," "C" and "D." The two capacitors "C" and "D" are in a common sub-array.

Figures 10, 11:
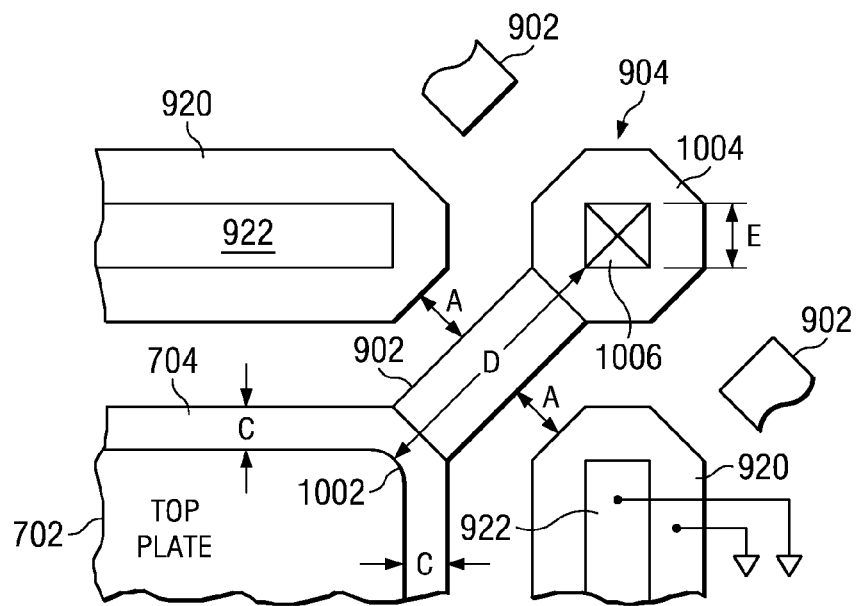
FIG. 10 illustrates a detail of a corner of one of the capacitors in FIG. 9.
FIG. 11 illustrates a top view of a complete unit capacitor without illustrating interconnections.

Referring now to FIG. 10, there is illustrated a detail of a corner of one of the capacitors in FIG. 9. The top plate 702, at the corner thereof, has a rounded edge 1002. This rounded edge is proximate to the protrusion 902 which, in this capacitor, is connected to the interconnect 904 in the corner thereof. The interconnect 904 is comprised of a pad 1004 and an actual interconnect or via 1006 disposed there through. This via 1006 or interconnect has a dimension "E" as noted hereinabove, which must be a certain distance from any edge of the pad 1004. This provides the interconnect 904 for interconnecting to the M2 layer. The protrusion 902 for this capacitor is connected to one side of the pad 1004 and it is structured such that it is disposed the distance "A" from the edge of the street structure 920, this being the noted restriction of the design rules. The design rules require the actual via 1006 through the pad 1004 to be a distance of "D" from the edge of the top plate 702. Since the interconnect 904 is disposed at the edge of each of the capacitors, the diagonal will easily exceed this. It can be seen that, with this structure, there is no edge of the capacitor that requires the dimension "D" to be accommodated. Therefore, the edges of the top plate 702 can be disposed from the edges of the bottom plate 704 by the minimum distance of "C." This can significantly increase the usage of the area. This particular example illustrates additional protrusions 902 that are not interconnected with the pad 1004, since they are not to be interconnected with the interconnected capacitor.

Referring now to FIG. 11, there is illustrated a top view of a complete unit capacitor without illustrating interconnections. This illustrates only the M4 bottom plate layer and the TPL. Each of the capacitors and the associated bottom plate 706 have a protrusion 902 disposed at each corner thereof that is connected to an associated corner interconnect 904. The protrusions 902 can be connected to the pad 1004 associated with the interconnect 904 when it is desirable to either interconnect the particular capacitor with another capacitor or a switch or with an adjacent capacitor. Thus, the only difference between, for example, a single unit capacitor and two adjacently coupled capacitors is the amount of metal required to make the interconnect. This is fairly small relative to the overall capacitor area and, it can be seen that it does not add significant parasitics, since the street structure 920 is provided to isolate the particular protrusion 902 from the remaining part of the capacitor. Each of the street structures 922 that are associated with a TPL from which the top plate 702 is fabricated are connected through vias 1102 to the street structure 920, such that both are connected to ground.

Figure 12:
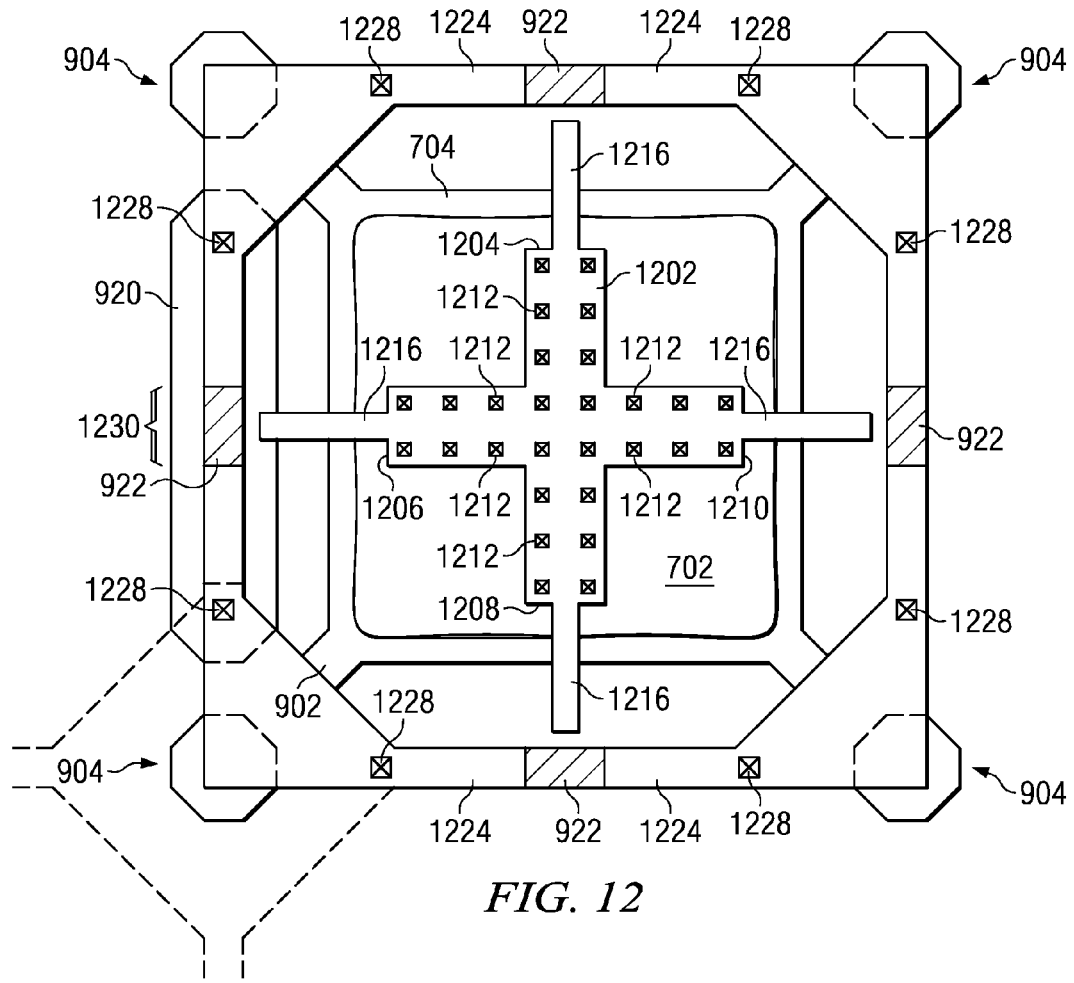
FIG. 12, there is illustrated a top level view illustrating the top plate capacitor interconnect.

Referring now to FIG. 12, there is illustrated a top level view illustrating the top plate capacitor interconnect in the M5 layer. Only one of the street structures 920 is illustrated on one of the edges for clarity purposes.

Each of the capacitors has an interconnect structure 1202 associated therewith that is disposed in the M5 layer, the top metal layer in the structure. Although not noted hereinabove, the capacitors are formed in accordance with the fabrication rules of the manufacturer such that the TPL is always between the top most layer and the next lower layer. Thus, the structure 1202 is formed in the top most metal layer. This structure is a "cross" shape such that it has four arms, 1204, 1206, 1208 and 1210. There are provided a plurality of interconnecting vias 1212 dispersed throughout the structure 1202 to the TPL to connect to the top plate of the capacitor.

Figure 13:
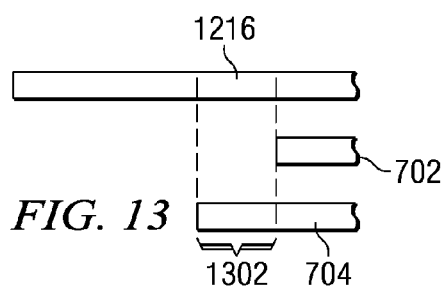
FIG. 13 illustrates an overlap between the top plate interconnection and the bottom plate of the capacitors at the interconnection of adjacent capacitors.

Each of the arms 1206 extends outward toward one edge of the top plate 702 and is perpendicular thereto, but does not extend completely to the edge thereof. Proximate to the edge, each of the arms 1206 has a protrusion 1216 extending therefrom and outward across both the edge of the top plate 702 and the edge of the bottom plate 704 and over the two overlying street structures 920 and 922. The M5 layer also has a street structure associated therewith. This street structure is comprised of four "angle" street structures 1224. Each of the angle structures 1224 extends from a point proximate to the protrusion 1216 around the corner covering a portion of the interconnect 904 to the mid portion of an adjacent side. It is substantially the same width, in this embodiment, as the street structure 922 and is connected to the underlying street structures 920 and 922 with vias 1228. It can be seen that all that is required to interconnect top plates is to extend the protrusion 1216 through an opening 1230 in the street structure 1224 and over the street structure 922 such that the top plates of all of the adjacent capacitors in the array can be connected. However, at the edge of the array, there will be a capacitor having one of the protrusions 1216 unconnected. By extending this protrusion over the edge of the bottom plate, there will be minimal parasitic differences between capacitors in the middle of the array and edge capacitors in the array. This is illustrated in FIG. 13 with an overlap 1302.

Figure 14:
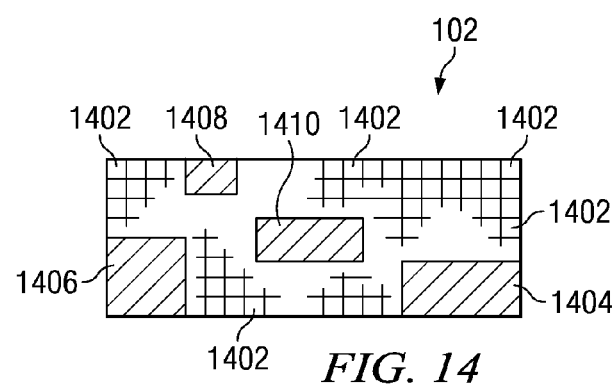
FIG. 14 illustrates a top view of the entire array.

Referring now to FIG. 14, there is illustrated a top view of the entire array. As noted hereinabove, the array 102 is fabricated from a plurality of capacitors which are interconnected at the corners via the protrusions 902. In the embodiment of FIG. 14, there are provided a plurality of array capacitors 1402 arranged in substantially rows and columns, each being a substantially rectangular capacitor. Each of these capacitors 1402 are identical prior to connection as described hereinabove, they comprising the unit capacitor "C." The capacitors are interconnected on the top most metal layer, the interconnect or M5 layer in this disclosed embodiment, to provide the top plate of the array 102. The interconnection for the bottom plates of the capacitors is provided in the third metal layer below the top metal layer, the M2 layer in this embodiment. If the top metal layer is M5, then the bottom plate layer is M4; if the planarization layer is M3, then the interconnect layer is M2. Below the planarization layer, and possibly below the interconnect M2 layer, there is provided under the array 102 active circuitry. There are illustrated four blocks of active circuitry, active circuitry 1404, active circuitry 1406, active circuitry 1408 and active circuitry 1410. The planarization layer at the M3 metal layer in this embodiment, provides a planarizing effect such that the oxide thickness in each of the capacitors problems due to underlying circuitry will be substantially minimized, if not eliminated. Thus, with the use of the planarization layer, active circuitry can be tolerated under the capacitor region.

Although the preferred embodiment has been described in detail, it should be understood that various changes, substitutions and alterations can be made therein without departing from the spirit and scope of the invention as defined by the appended claims.

What is claimed is:

1. A capacitor structure in an integrated circuit, comprising:
   a semiconductor substrate;
   a capacitor region defined within the boundaries of said semiconductor substrate;
   an active circuit layer formed on the surface of said semiconductor substrate with a portion thereof formed in the surface of said semiconductor substrate and a portion thereof formed over the surface of said semiconductor substrate, in which is formed active circuitry and interconnects;
   a planarization layer of metal disposed over said active circuit layer and electrically isolated therefrom in at least said capacitor region;
   a metal capacitor layer formed over said planarization layer within said capacitor region and having the bottom plates of a plurality of capacitors defined therein;
   a layer of dielectric formed on said bottom plates of said plurality of capacitors of a predetermined thickness;
   a top plate formed on said dielectric for each of said plurality of capacitors to define each of said plurality of capacitors, such that a portion of each of said bottom plates extends outside of the boundaries of said associated top plate; and
   a plurality of vias connected to said portion of select ones of said bottom plates and to structures beneath said planarization layer, and wherein vias are not formed within the region beneath said top plate and above said planarization layer.

2. The capacitor structure of claim 1, where each of said capacitors is substantially identical to the others thereof within said capacitor region.

3. The capacitor structure of claim 2, wherein said plurality of capacitors form an array of capacitors.

4. The capacitor structure of claim 1, wherein at least a portion of said active circuitry on said semiconductor substrate is disposed under at least a portion of ones of said top plates.

5. The capacitor structure of claim 3, wherein each of said capacitors has a street formed around the periphery thereof.

6. The capacitor structure of claim 5, wherein each of said bottom plates has associated therewith at least one of said vias proximate the edge thereof and has a programmable plug associated therewith that can be programmed for electrical connection to said associated via during fabrication of the integrated circuit.

7. The capacitor structure of claim 6, wherein each of said plurality of capacitors has said bottom plates thereof disposed in an array of columns and rows and said vias are disposed in an interlaced arrangement with said bottom plates, such that each of said vias can be programmed to be connect to none or four of said bottom plates.

8. The capacitor structure of claim 7, wherein said bottom plates are rectangular shaped and said vias are disposed proximate the corners thereof and said streets are disposed between said vias.

9. The capacitor structure of claim 1, wherein said planarization layer is connected to a reference voltage.

10. A method for forming a capacitor structure in an integrated circuit, comprising the steps of:
    providing a semiconductor substrate;
    defining a capacitor region within the boundaries of the semiconductor substrate;
    forming an active circuit layer on the surface of the semiconductor substrate with a portion thereof formed in the surface of the semiconductor substrate and a portion thereof formed over the surface of the semiconductor substrate, in which is formed active circuitry and interconnects;
    forming a planarization layer of metal over the active circuit layer and electrically isolated therefrom in at least the capacitor region;
    forming a metal capacitor layer over the planarization layer within the capacitor region and having the bottom plates of a plurality of capacitors defined therein;
    forming a layer of dielectric on the bottom plates of the plurality of capacitors of a predetermined thickness;
    forming a top plate on the dielectric for each of the plurality of capacitors to define each of the plurality of capacitors, such that a portion of each of the bottom plates extends outside of the boundaries of the associated top plate; and
    forming a plurality of vias connected to the portion of select ones of the bottom plates and to structures beneath the planarization layer, and wherein vias are not formed within the region beneath the top plate and above the planarization layer.

11. The capacitor structure of claim 10, where each of the capacitors is substantially identical to the others thereof within the capacitor region.

12. The capacitor structure of claim 11, wherein the plurality of capacitors form an array of capacitors.

13. The capacitor structure of claim 10, wherein at least a portion of the active circuitry on the semiconductor substrate is disposed under at least a portion of ones of the top plates.

14. The capacitor structure of claim 12, wherein each of the capacitors has a street formed around the periphery thereof.

15. The capacitor structure of claim 14, wherein each of the bottom plates has associated therewith at least one of the vias proximate the edge thereof and has a programmable plug associated therewith that can be programmed for electrical connection to the associated via during fabrication of the integrated circuit.

16. The capacitor structure of claim 15, wherein each of the plurality of capacitors has the bottom plates thereof disposed in an array of columns and rows and the vias are disposed in an interlaced arrangement with the bottom plates, such that each of the vias can be programmed to be connect to none or four of the bottom plates.

17. The capacitor structure of claim 16, wherein the bottom plates are rectangular shaped and the vias are disposed proximate the corners thereof and the streets are disposed between the vias.

18. The capacitor structure of claim 10, wherein the planarization layer is connected to a reference voltage.

* * * * *